US010212866B2

(12) United States Patent
Kurata

(10) Patent No.: US 10,212,866 B2
(45) Date of Patent: Feb. 19, 2019

(54) ELECTRONIC COMPONENT MOUNTING SYSTEM AND ELECTRONIC COMPONENT MOUNTING METHOD

(71) Applicant: Panasonic Intellectual Property Management Co., Ltd., Osaka (JP)

(72) Inventor: Hiroaki Kurata, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 267 days.

(21) Appl. No.: 15/267,069

(22) Filed: Sep. 15, 2016

(65) Prior Publication Data

US 2017/0099751 A1 Apr. 6, 2017

(30) Foreign Application Priority Data

Oct. 5, 2015 (JP) ................................. 2015-197269

(51) Int. Cl.
| | |
|---|---|
| *B23P 19/00* | (2006.01) |
| *H05K 13/04* | (2006.01) |
| *H05K 13/02* | (2006.01) |
| *H05K 13/08* | (2006.01) |

(52) U.S. Cl.
CPC ........... *H05K 13/04* (2013.01); *H05K 13/021* (2013.01); *H05K 13/084* (2018.08); *H05K 13/086* (2018.08); *Y10T 29/53174* (2015.01)

(58) Field of Classification Search
CPC H01L 2924/00; B23K 2101/40; H05K 13/04; H05K 2201/10984; Y10T 428/25; Y10T 29/53174; B65D 75/38; B65D 81/268

USPC ............................ 29/739, 740, 832, 834, 836
See application file for complete search history.

(56) References Cited

U.S. PATENT DOCUMENTS

| | | | |
|---|---|---|---|
| 6,413,353 B2 * | 7/2002 | Pompeo | C09J 5/06 156/307.3 |
| 2012/0048919 A1 * | 3/2012 | Okada | H05K 13/0417 235/375 |
| 2014/0230241 A1 | 8/2014 | Yamasaki et al. | |

FOREIGN PATENT DOCUMENTS

JP 2013-235906 11/2013

* cited by examiner

*Primary Examiner* — Thiem Phan
(74) *Attorney, Agent, or Firm* — Pearne & Gordon LLP

(57) ABSTRACT

An electronic component system includes an electronic component mounting line mounting an electronic component on a board (exposure managing board) for which management of exposure time is necessary, a package ID reader (recognition unit) which recognizes a package code (identification information) that is applied to a package bag, and a storage unit which stores an exposure time limit which is permissible from an open time before reaching a management release in which management of the exposure time is unnecessary. In the electronic component mounting system, the package code is read while the package bag is open, the read time is stored as the open time, an expected duration is calculated which is necessary from a predetermined point of time before reaching the management release, and it is determined whether or not the exposure time limit is exceeded before the board which is exposed in the atmosphere reaches the management release.

16 Claims, 11 Drawing Sheets

ELECTRONIC COMPONENT MOUNTING SYSTEM AND ELECTRONIC COMPONENT MOUNTING METHOD

BACKGROUND

1. Technical Field

The present disclosure relates to an electronic component mounting system and an electronic component mounting method for mounting an electronic component on a board.

2. Description of the Related Art

The electronic component mounting system produces a mounting board by mounting an electronic component such as a package component that is sealed by a resin in advance on a printed board, a flexible board, or the like. In a package component, there is a device with high moisture sensitivity (moisture sensitive device, hereinafter abbreviated to MSD) in which humidity greatly influences mounting quality after reflow. In the MSD that is deteriorated by moisture absorption, there is a concern that material defects are generated on the mounting board in a production process of the mounting board. Therefore, a system is suggested for appropriately managing use of the MSD that is exposed to the atmosphere for mounting from a state of being kept such that a dry state is maintained by preventing moisture absorption (refer to PTL 1).

Meanwhile, even on the board on which the electronic component is mounted, deterioration may be generated which influences mounting quality such as warping of the board itself due to moisture absorption, peeling of a circuit pattern on the board, and rust on an electrode surface which is bonded to a terminal of the electronic component. Therefore, the board with high humidity sensitivity is delivered to a component mounting factory from a board maker in a packaged state using a humidity-proof bag which protects the board from humidity in the atmosphere. Then, component mounting work is performed with respect to the board that is picked up by opening the humidity-proof bag immediately prior.

CITATION LIST

Patent Literature

PTL 1: Japanese Patent Unexamined Publication No. 2013-235906

SUMMARY

There is provided an electronic component mounting system of the present disclosure, which produces a mounting board, including an electronic component mounting line which produces a mounting board by mounting an electronic component on an exposure managing board for which management is necessary of an exposure time of exposure in the atmosphere by opening a package bag that is protected from the atmosphere, a recognition unit which recognizes identification information that is applied to the package bag, a storage unit which stores an exposure time limit which is permissible from the exposure managing board being exposed in the atmosphere before reaching a management release in which management of the exposure time is unnecessary, a required time calculator which calculates an expected duration which is necessary from a predetermined point of time before reaching the management release, and a determination unit which determines whether or not the exposure time limit is exceeded before the exposure managing board that is exposed in the atmosphere reaches the management release, in which the recognition unit reads the identification information during opening of the package bag, the storage unit stores a time at which the identification information is read by the recognition unit as an open time, and the determination unit determines whether or not the exposure time limit is exceeded before the exposure managing board that is exposed in the atmosphere reaches the management release based on the calculated expected duration and the open time.

There is provided another electronic component mounting system of the disclosure, which produces a mounting board, including the electronic component mounting line which produces the mounting board by mounting the electronic component on an exposure managing board for which management is necessary of an exposure time of exposure in the atmosphere by opening a package bag that is protected from the atmosphere, a production plan which includes a production number and a production period of the mounting board on which the exposure managing board is used, a storage unit which stores an exposure time limit which is permissible from the exposure managing board being exposed in the atmosphere before reaching a management release in which management of the exposure time is unnecessary, a required time calculator which calculates an expected duration which is necessary from a predetermined point of time before reaching the management release, and a production plan determination unit which determines whether or not it is possible to produce the mounting board without the exposure managing board exceeding the exposure time limit based on the production plan and the calculated expected duration.

There is provided an electronic component mounting method of the disclosure, which produces a mounting board, in an electronic component mounting system including an electronic component mounting line which produces a mounting board by mounting the electronic component on an exposure managing board for which management is necessary of an exposure time of exposure in the atmosphere by opening a package bag that is protected from the atmosphere, a recognition unit which recognizes identification information that is applied to the package bag, and a storage unit which stores the exposure time limit which is permissible from the exposure managing board being exposed to the atmosphere before reaching a management release in which management of the exposure time is unnecessary, the method including reading identification information during opening of the package bag using the recognition unit, storing a time at which the identification information is read in the storage unit as an open time, calculating an expected duration which is necessary from a predetermined point of time before reaching the management release, and determining whether or not the exposure time limit is exceeded before the exposure managing board that is exposed in the atmosphere reaches the management release based on the calculated expected duration and the open time.

There is provided another electronic component mounting method of the disclosure, which produces a mounting board, in an electronic component mounting line which produces the mounting board by mounting the electronic component on an exposure managing board for which management is necessary of an exposure time of exposure in the atmosphere by opening a package bag that is protected from the atmosphere, a production plan which includes a production number and a production period of the mounting board on which the exposure managing board is used, and a storage unit which stores an exposure time limit which is permissible from the exposure managing board being exposed in the atmosphere before reaching a management release in which management of the exposure time is unnecessary, the method including calculating the expected duration which is necessary from a predetermined point of time before reaching the management release, and determining whether or not it is possible to produce the mounting board without the exposure managing board exceeding the exposure time limit based on the production plan and the calculated expected duration.

According to the disclosure, it is possible to manage quality of the mounting board in a production of the mounting board which mounts the electronic component on the board on which management is necessary with respect to humidity absorption and oxidization.

DETAILED DESCRIPTION

Prior to description of the embodiment of the disclosure, problems in the related art will be simply described.

In the related art which includes PTL 1, there is a problem in that moisture absorption or oxidization with respect to a board with high humidity sensitivity, or influence of both is not considered in a production process of a mounting board, and production efficiency is reduced without failure being found up to a completion test.

Therefore, the present disclosure has an object of providing an electronic component mounting system and an electronic component mounting method which are able to manage quality of a mounting board in a production process of the mounting board which mounts an electronic component on the board on which management is necessary with respect to moisture absorption and oxidization.

Figure 1:
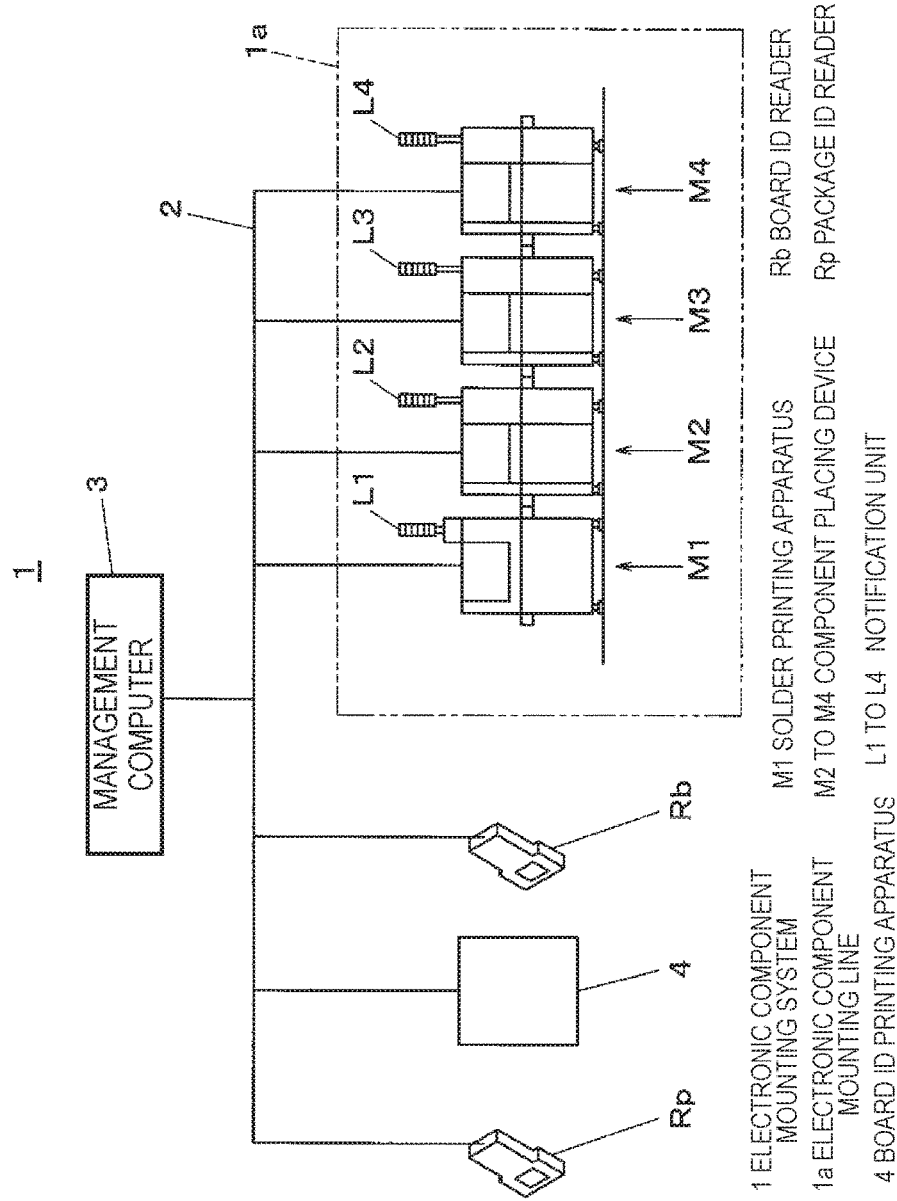
FIG. 1 is a configuration explanatory diagram of an electronic component mounting system of an embodiment of the disclosure.

Next, an embodiment of the present disclosure will be described below with reference to the drawings. First, with reference to FIG. 1, a configuration of electronic component mounting system 1 will be described. Electronic component mounting system 1 has a function of producing the mounting board by mounting the electronic component on the board. Electronic component mounting system 1 is provided with electronic component mounting line 1a in which a plurality of electronic component mounting devices are connected, board ID printing apparatus 4, package ID reader Rp, board ID reader Rb, management computer 3 which governs each device of electronic component mounting system 1, and communication network 2 that links the components.

Electronic component mounting line 1a is configured to connect in series solder printing apparatus M1 and component placing devices M2 to M4 which are electronic component mounting devices. Solder printing apparatus M1 prints solder on the board that is a mounting target. Component placing devices M2 to M4 respectively place the electronic components on the board. Each electronic component mounting device is provided with notification units L1 to L4 such as indicator lights. Each component mounting device of the electronic component mounting line 1a has a board transport mechanism which transports the board, and is formed by a board transport path connected in series to the devices. Electronic component mounting line 1a performs solder printing work and electronic component placement work with respect to the board which is transported along a board transport path.

The board on which the electronic component is placed is loaded on a reflow device (illustration omitted), and solder for component bonding is melted and solidifies by heating in accordance with a predetermined heating profile. Thereby, the electronic component is bonded to the board by solder, and the mounting board on which the electronic component is mounted on the board is completed. Note that, electronic component mounting system 1 may be provided with a plurality of electronic component mounting lines 1a according to the produced mounting board, or for example, may be configured by one component placing device M2 to M4 without being limited to the configuration of the electronic component mounting device that has electronic component mounting line 1a in the example in FIG. 1.

Figure 4:
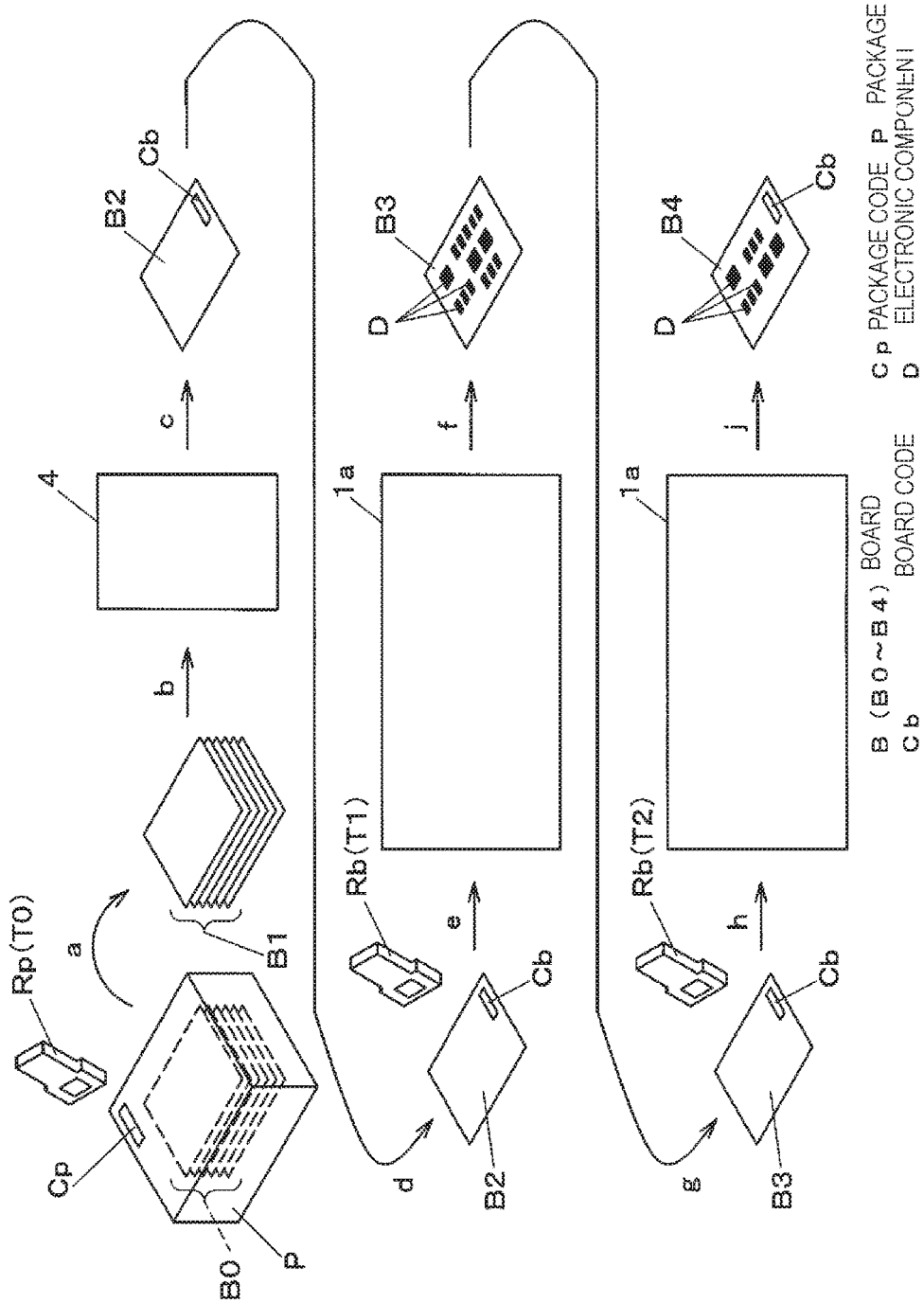
FIG. 4 is an explanatory diagram of the electronic component mounting method of an embodiment of the disclosure.

Here, the board on which electronic component D is mounted, board ID printing apparatus 4, package ID reader Rp, and board ID reader Rb are described with reference to FIG. 4. In the embodiment, the mounting board is produced by mounting electronic component D on the exposure managing board (hereinafter, simply referred to as "board B") that it is necessary to manage with respect to moisture absorption or oxidization, or both. Board B is transported in a factory in which the mounting board is produced from the board maker in a state in which one or two or more boards are collectively packaged in package bag P that is protected from moisture in the atmosphere.

Package code Cp (identification information) such as a barcode is applied to each package bag P. Package code Cp is integral to each package bag P, and it is possible to identify board B that is packaged in package bag P using package code Cp. Applied package code Cp is read by package ID reader Rp, and recognized package code Cp is transmitted and stored in management computer 3. Board ID printing apparatus 4 (board ID applying unit) prints integrated board code Cb (board ID) on board B by laser marking and the like. Printed board code Cb is read by board ID reader Rb, and recognized board code Cb is transmitted and stored in management computer 3.

Next, a printing system of electronic component mounting system 1 will be described with reference to FIG. 2. Solder printing apparatus M1 is provided with printing control unit 11, printing storage unit 12, printing work unit 13, notification unit L1, and communication unit 14. Printing storage unit 12 stores data for electronic component mounting which includes printing work parameters that are necessary in control of printing work unit 13 using printing control unit 11. Printing control unit 11 controls printing work unit 13 based on the data for electronic component mounting, and executes solder printing work in which solder for component bonding is screen printed on board B that is loaded on solder printing apparatus M1.

Notification unit L1 is an indicator light, and notifies by lighting a predetermined lamp in a case such as where board B is present in which exposure time limit Tx described below is exceeded. Note that, notification unit L1 is not limited to an indicator light, and as long as it is possible to notify to an operator that board B is present, a revolving light, a buzzer, a liquid crystal panel, and the like may be used. Communication unit 14 is a communication interface, and performs transfer of a signal with management computer 3 via communication network 2. Production information such as of a state of board B during loading, taking out, and printing work of board B to solder printing apparatus M1 is transmitted to management computer 3 at a predetermined timing by communication unit 14.

Figure 2:
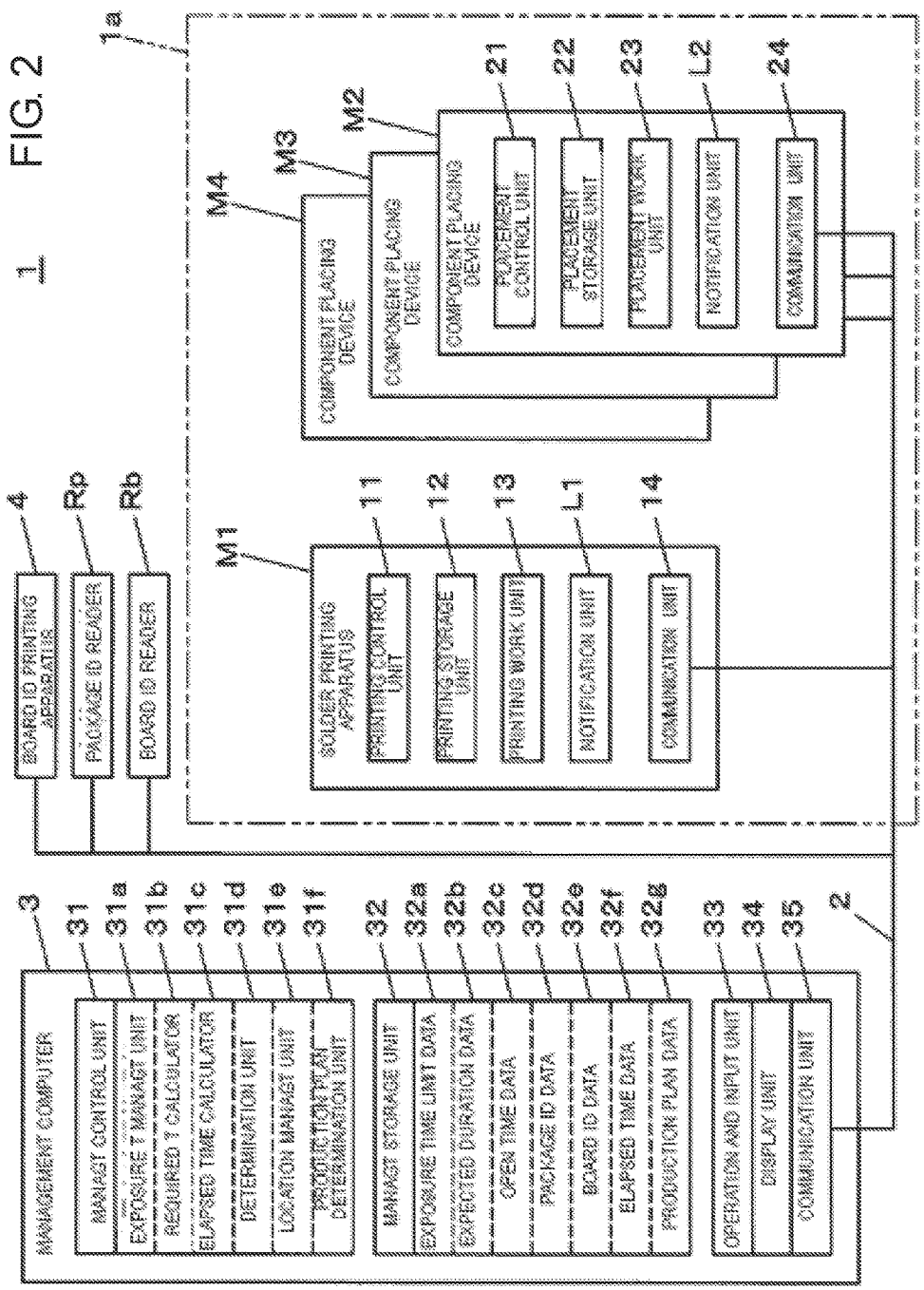
FIG. 2 is a block diagram illustrating a configuration of a control system of the electronic component mounting system of an embodiment of the disclosure.

In FIG. 2, component placing devices M2 to M4 have the same configuration, and here, component placing device M2 will be described. Component placing device M2 is provided with placement control unit 21, placement storage unit 22, placement work unit 23, notification unit L2, and communication unit 24. Placement storage unit 22 stores data for electronic component mounting which includes placement work parameters that are necessary in control of placement work unit 23 using placement control unit 21. Placement control unit 21 controls placement work unit 23 based on the data for electronic component mounting, and executes electronic component placement work in which electronic component D is placed on board B after solder printing is loaded on component placing device M2. Notification unit L2 and communication unit 24 respectively have the same function as notification unit L1 and communication unit 14 of solder printing apparatus M1.

In FIG. 2, management computer 3 is provided with management control unit 31, management storage unit 32, operation and input unit 33, display unit 34, and communication unit 35. Management control unit 31 is a computation device such as a CPU, and has an internal process unit such as exposure time management unit 31a, required time calculator 31b, elapsed time calculator 31c, determination unit 31d, location management unit 31e, and production plan determination unit 31f. Management storage unit 32 is a storage device, and stores data such as data for electronic component mounting for collectively controlling electronic component mounting system 1, exposure time limit data 32a, expected duration data 32b, open time data 32c, package ID data 32d, board ID data 32e, elapsed time data 32f, and production plan data 32g.

Exposure time limit data 32a is data which includes exposure time limit Tx which is permissible before board B which is exposed in the atmosphere by opening package bag P reaches management release process Q in which management of exposure time Te of exposure in the atmosphere is unnecessary. Management release process Q is determined to be, for example, a process in which final electronic component D is placed on board B prior to reflow, a process in which board B on which electronic component D is placed is loaded on the reflow device, a process in which reflow is completed in the reflow device, and the like considering a characteristic or the like of board B or placed electronic component D. In this manner, exposure time limit Tx which is permissible after board B (exposure managing board) is exposed in the atmosphere before reaching management release process Q in which management of exposure time Te is unnecessary is stored in management storage unit 32 (storage unit).

In a case where exposure time management unit 31a monitors exposure time Te of each board B, and exposure time limit Tx before board B reaches management release process Q is exceeded, exposure time management processes for warning to display unit 34 of management computer 3 or notification units L1 to L4 of the electronic component mounting device of electronic component mounting line 1a are collectively controlled. Required time calculator 31b calculates expected duration Tp which is necessary from a predetermined point of time such as open time T0 in which board B is exposed in the atmosphere by opening package bag P or a loading time at which board B is loaded on electronic component mounting line 1a before reaching management release process Q. Calculated expected duration Tp is stored in management storage unit 32 as expected duration data 32b.

In FIG. 2, package ID reader Rp reads package code Cp that is applied to package bag P, and read package code Cp is stored in management storage unit 32 as package ID data 32d. In addition, a reading time when package code Cp is read by package ID reader Rp immediately prior to opening of package bag P or immediately after opening (while package bag P is open) is stored in management storage unit 32 as open time T0 which is included in open time data 32c that is tied to package code Cp.

In this manner, package ID reader Rp is a recognition unit which recognizes package code Cp (identification information) that is applied to package bag P. In addition, package ID reader Rp (recognition unit) reads package code Cp (identification information) while package bag P is open, and management storage unit 32 (storage unit) stores a time in which package ID reader Rp (recognition unit) reads package code Cp (identification information) as open time T0.

In addition, package ID reader Rp has a function as a line side reading unit which reads package code Cp (identification information) that is applied to package bag P in which board B (exposure managing board) that is loaded on electronic component mounting line 1a is packaged. In this case, read package ID data 32d is used as information which identifies board B that is packaged in package bag P by verifying stored package ID data 32d. For example, when board B is loaded on electronic component mounting line 1a, again, board B and board B that is collectively packaged in package bag P are specified by reading package code Cp that is applied to package bag P. Furthermore, open time T0 in which package bag P is open is specified by open time data 32c that is tied to package code Cp.

In FIG. 2, board ID printing apparatus 4 is the board ID applying unit which prints (applies) board code Cb (board ID) to board B (exposure managing board) that is exposed in the atmosphere by opening package bag P by laser marking and the like. Printed board code Cb is stored in management storage unit 32 as board ID data 32e. When board code Cb is printed, board ID data 32e is information in which board B that is collectively packaged in package bag P is specified by reading package code Cp that is applied to package bag P and storing tied to board ID data 32e.

Board ID reader Rb (line side reading unit) reads board code Cb (board ID) that is printed on (applied to) board B (exposure managing board) that is loaded on electronic component mounting line 1a. Read board code Cb is specified by package code Cp of package bag P that packages board B and board B that is collectively packaged with package bag P is specified by verifying stored board ID data 32e. Furthermore, open time T0 in which package bag P is open is specified by open time data 32c that is tied to package code Cp.

In FIG. 2, elapsed time calculator 31c calculates a time from open time T0 until a time at which board code Cb (board ID) is read by board ID reader Rb (line side reading unit) as elapsed time Tt. In addition, elapsed time calculator 31c calculates a time from open time T0 until a time at which package code Cp (identification information) is read by package ID reader Rp (line side reading unit) as elapsed time Tt. Calculated elapsed time Tt is stored in management storage unit 32 (storage unit) as elapsed time data 32f.

Elapsed time Tt is exposure time Te that elapses from exposure of board B (exposure managing board) in the atmosphere before the code (board code Cb or package code Cp) that is applied to board B or package bag P is read by the line side reading unit (board ID reader Rb or package ID reader Rp).

In FIG. 2, determination unit 31d determines whether or not exposure time limit Tx is exceeded before board B (exposure managing board) that is exposed in the atmosphere reaches management release process Q based on open time T0 that is stored in calculated expected duration Tp and open time data 32c by required time calculator 31b. In addition, determination unit 31d determines whether or not exposure time limit Tx is exceeded before board B (exposure managing board) (exposure managing board read by board ID) that is loaded on electronic component mounting line 1a reaches management release process Q based on expected duration Tp calculated by required time calculator 31b and elapsed time Tt that is calculated by elapsed time calculator 31c.

Location management unit 31e manages respective locations of board B based on information in which electronic component mounting line 1a produces the mounting board such that board B (exposure managing board) that is loaded on electronic component mounting line 1a is present in any of the electronic component mounting devices (solder printing apparatus M1, component placing devices M2 to M4, and the like) of electronic component mounting line 1a. Location management unit 31e ascertains the location of each board B in electronic component mounting line 1a from production information and the like which includes a state of board B during work which is transmitted at a predetermined timing such as during loading and taking out of board B from each electronic component mounting device to management computer 3.

In a case where board B is determined to exceed exposure time limit Tx by determination unit 31d, exposure time management unit 31a displays information on board B in which exposure time limit Tx is exceeded on display unit 34 of management computer 3. In addition, exposure time management unit 31a notifies that board B is present which exceeds exposure time limit Tx to notification units L1 to L4 of the electronic component mounting device on which board B is present in which it is determined by determination unit 31d that exposure time limit Tx is exceeded based on the location of board B which is managed by location management unit 31e.

In FIG. 2, production plan data 32g is data which stores a production number of the mounting board on which board B (exposure managing board) is used, production plan S which includes a production period, or the like. Production plan determination unit 31f determines whether or not production of the mounting board is possible without board B (exposure managing board) exceeding exposure time limit Tx based on production plan S and expected duration Tp which is calculated by required time calculator 31b.

In addition, the number of boards B which are collectively packaged in package bag P, a configuration of the electronic component mounting device of electronic component mounting line 1a, tact time at which board B that is produced by the electronic component mounting device is delivered, and the like are used in production plan determination by production plan determination unit 31f. From this information, production plan determination unit 31f determines whether or not there is valid production plan S which is able to be produced in the production period that is prearranged by the mounting board of the prearranged production number without board B that is exposed in the atmosphere sequentially by opening package bag P exceeding exposure time limit Tx.

Operation and input unit 33 is an input device such as a keyboard, a touch panel, or a mouse, and is used during the operation command or data input. Display unit 34 is a display device such as a liquid crystal panel, and a guide screen or various screens such as of information on board B (exposure managing board) whose exposure time limit Tx is exceeded are displayed during operation by operation and input unit 33. Communication unit 35 is a communication interface, and performs transfer of a signal between the electronic component mounting device of electronic component mounting line 1a, board ID printing apparatus 4, package ID reader Rp, and board ID reader Rb via communication network 2.

Figure 3:
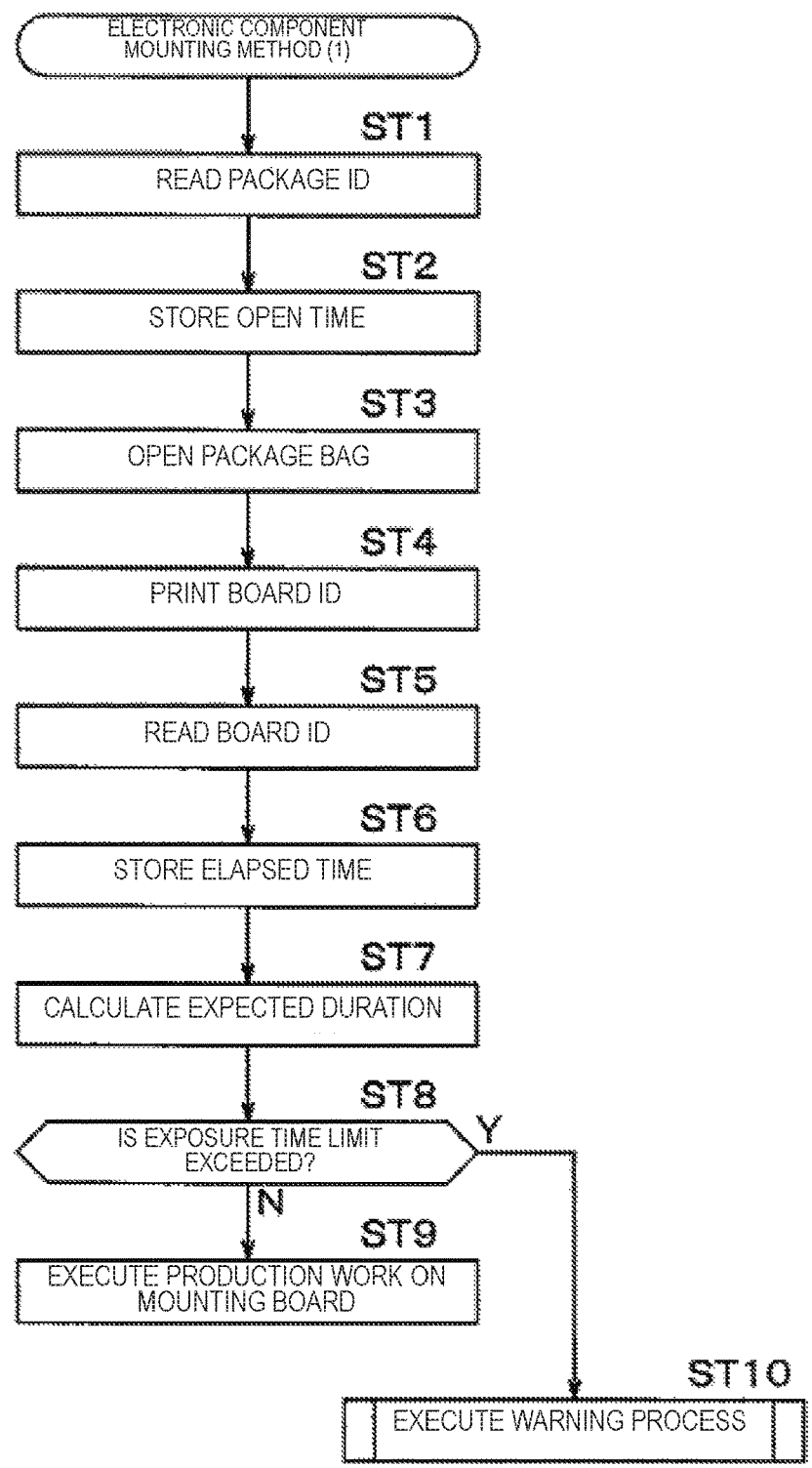
FIG. 3 is a flow diagram of an electronic component mounting method of an embodiment of the disclosure.

Next, a first applied example of an electronic component mounting method which produces the mounting board by mounting electronic component D on board B (exposure managing board) in which management is necessary of exposure time Te which of exposure in the atmosphere by opening package bag P that is protected from the atmosphere will be described while referencing FIGS. 4 and 5 in line with the flow in FIG. 3. Here, an example is described in which electronic component D is mounted on both surfaces of board B in order on a rear surface and a front surface of board B. First, package code Cp that is applied to package bag P is read by package ID reader Rp and is stored as package ID data 32d (ST1), and the read time is stored as open time T0 (ST2). Next, package bag P is opened by the operator (ST3).

That is, ST1 and ST3 are package ID reading processes in which package code Cp (identification information) is read by package ID reader Rp (recognition unit) during opening of package bag P. In addition, ST2 is a process in which the time at which package code Cp (identification information) is read is stored in management storage unit 32 (storage unit) as open time T0. Note that, reading of package code Cp may be immediately after opening of package bag P. That is, the order of ST1, ST2, and ST3 may be appropriately interchanged. In FIG. 4, board B0 (here, six) which are collectively packaged in package bag P is picked up in the atmosphere by opening package bag P (arrow a).

Next, board code Cb (board ID) is printed (applied) on board B (exposure managing board) by board ID printing apparatus 4 (board ID application unit) (ST4: board ID application process). The information of applied board code Cb is stored as board ID data 32e. In FIG. 4, board B1 that is picked up from package bag P is loaded on board ID printing apparatus 4 in order (arrow b), and board code Cb is printed (arrow c).

Next, board B2 on which board code Cb is printed is transported up to electronic component mounting line 1a (arrow d), and board code Cb (board ID) that is applied to board B2 (exposure managing board) is read by board ID reader Rb (line side reading unit) (ST5: board ID reading process). Next, elapsed time calculator 31c stores a time from open time T0 until a time at which board code Cb (board ID) is read by board ID reader Rb (line side reading unit) (hereinafter, referred to as "rear surface loading time T1") as elapsed time Tt1 after board B2 (exposure managing board) is exposed in the atmosphere in management storage unit 32 (storage unit) (ST6: elapsed time storage process).

Next, required time calculator 31b calculates expected duration Tp1 which is necessary from rear surface loading time T1 (predetermined point of time) before reaching management release process Q, and stores as expected duration data 32b (ST7: required time calculation process). Next, determination unit 31d determines whether or not exposure time limit Tx is exceeded before board B2 (exposure managing board) on which board code Cb (board ID) is read reaches management release process Q based on calculated expected duration Tp1 and elapsed time Tt1 (ST8: determination process).

In the determination process (ST8), in a case where board B2 is determined not to exceed exposure time limit Tx (No), board B2 is loaded on electronic component mounting line 1a (arrow e), production work of the mounting board is executed in electronic component mounting line 1a (arrow f), and electronic component D is placed on the rear surface of board B3 (ST9). In the example of FIG. 5, since the sum of elapsed time Tt1 and expected duration Tp1 does not exceed exposure time limit Tx, No is determined in the determination process (ST8).

Note that, the board ID application process (ST4), the board ID reading process (ST5), and the elapsed time storage process (ST6) are omitted, and in the determination process (ST8), in place of elapsed time Tt1, it is also possible to determine based on the expected time that is taken before board B2 that is open in open time T0 is transported in electronic component mounting line 1a. That is, determination unit 31d determines whether or not exposure time limit Tx is exceeded before board B2 (exposure managing board) that is exposed in the atmosphere reaches management release process Q based on calculated expected duration Tp1 and open time T0. In this case, required time calculator 31b calculates expected duration Tp1 taking into account an expected average time and the like that is taken up to open board B2 being transported to electronic component mounting line 1a.

When electronic component D is placed on the rear surface of board B3, board B3 is transported to electronic component mounting line 1a on which electronic component D is placed on the front surface (arrow g). Next, in the same manner as a case where electronic component D is placed on the rear surface, board ID reading process (ST5), the elapsed time storage process (ST6), the required time calculation process (ST7), and the determination process (ST8) are performed. That is, elapsed time Tt2 is calculated from the time at which board code Cb of board B3 is read (hereinafter, referred to as "front surface loading time T2"), it is determined whether or not exposure time limit Tx is exceeded from calculated expected duration Tp2 before board B3 reaches management release process Q.

Figure 5:
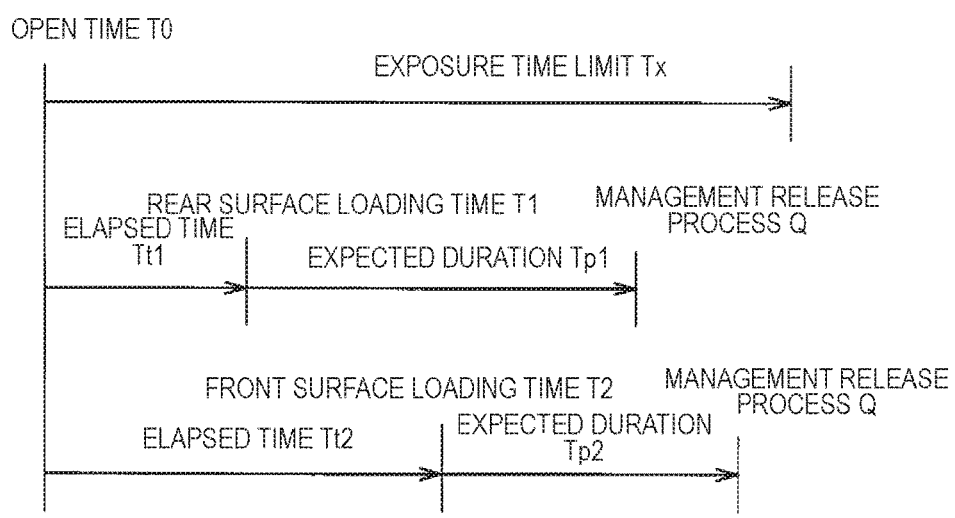
FIG. 5 is an explanatory diagram of an exposure time limit and an expected duration in the electronic component mounting method of an embodiment of the disclosure.

In the example of FIG. 5, since the sum of elapsed time Tt2 and expected duration Tp2 does not exceed exposure time limit Tx, No is determined in the determination process (ST8). Next, board B3 is loaded on electronic component mounting line 1a (arrow h), production work of the mounting board is executed in electronic component mounting line 1a (arrow j), and electronic component D is placed on the front surface of board B4.

In the determination process (ST8), in a case where it determined that the board B2 (B3) exceeds exposure time limit Tx (Yes) (hereinafter, referred to as "exceeded determination"), the warning process is executed by exposure time management unit 31a (ST10).

Figure 6:
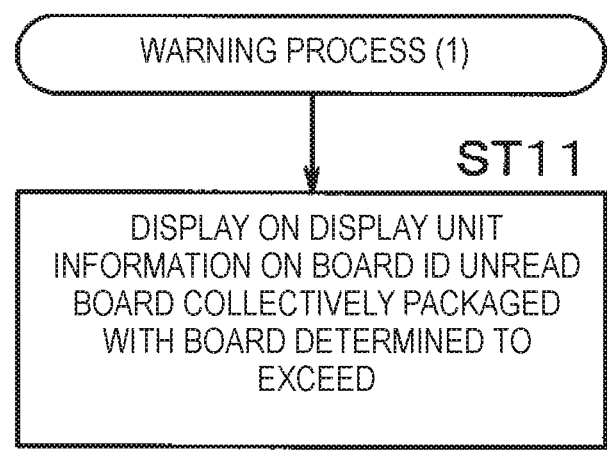
FIG. 6 is a flow diagram of a warning process in the electronic component mounting method of an embodiment of the disclosure.

Next, a first applied example of the warning process will be described with reference to FIG. 6. In this example, in a case where there is an exceeded determination in the determination process (ST8), exposure time management unit 31a displays information on board B for which board code Cb (board ID) is not read out of collectively packaged boards B (exposure managing board) that have an exceeded determination is displayed on display unit 34 (ST11). That is, although not yet loaded on electronic component mounting line 1a, in the determination process in which loading is to be carried out (ST8), information on board B that has an exceeded determination is displayed on display unit 34. Thereby, the operator is able to be aware at an early stage of information of another board B that exceeds exposure time limit Tx without executing work in which board code Cb is read.

Figure 7:
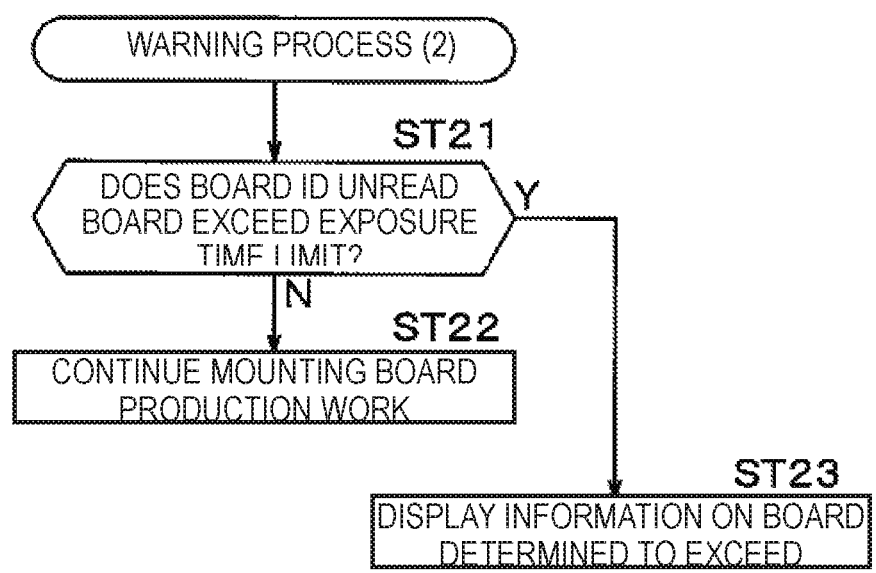
FIG. 7 is a flow diagram of a warning process in the electronic component mounting method of an embodiment of the disclosure.

Next, a second applied example of the warning process will be described with reference to FIG. 7. In this example, in a case where there is an exceeded determination in the determination process (ST8), determination unit 31d further determines whether or not exposure time limit Tx is exceeded before board B (exposure managing board) on which board code Cb (board ID) is not read reaches management release process Q (ST21). In a case where there is no exceeded determination (No in ST21), the production work of the mounting board is continued (ST22). In a case where there is an exceeded determination (Yes in ST21), exposure time management unit 31a displays information on board B (exposure managing board) that is determined to be exceeded on display unit 34 (ST23).

That is, regardless of whether there is packing in any package bag P, although not yet loaded on electronic component mounting line 1a, in the determination process in which loading is to be carried out (ST8), information of board B that has an exceeded determination is displayed on display unit 34. Thereby, the operator is able to be aware at an early stage of information of another board B that exceeds exposure time limit Tx without executing work in which board code Cb is read.

Figure 8:
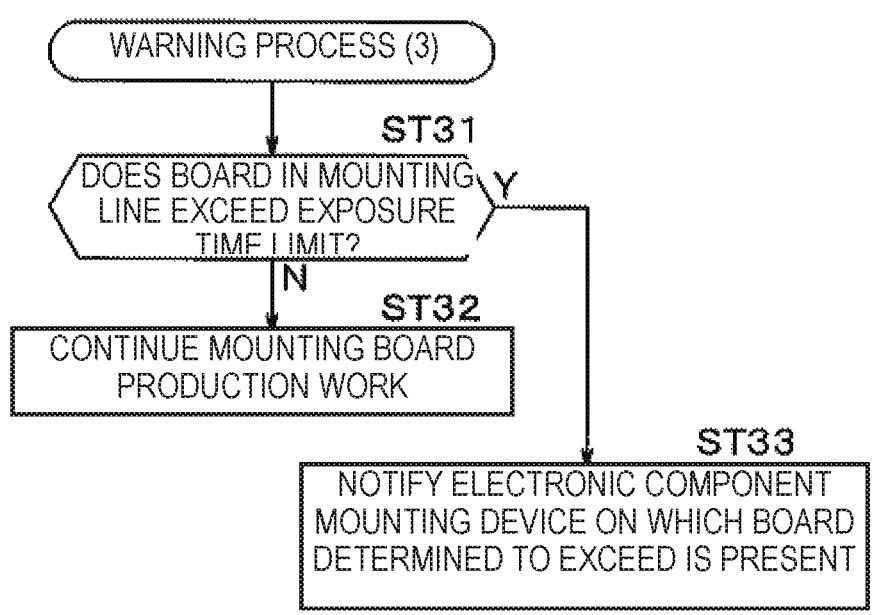
FIG. 8 is a flow diagram of a warning process in the electronic component mounting method of an embodiment of the disclosure.

Next, a third applied example of the warning process will be described with reference to FIG. 8. In this example, in a case where there is an exceeded determination in the determination process (ST8), determination unit 31d further determines whether or not exposure time limit Tx is exceeded before board B (exposure managing board) which is managed by location management unit 31e reaches management release process Q (ST31). In a case where there is no exceeded determination (No in ST31), the production work of the mounting board is continued (ST32). In a case where there is an exceeded determination (Yes in ST31), exposure time management unit 31*a* notifies that board B is present which exceeds exposure time limit Tx to notification units L1 to L4 of the electronic component mounting device on which board B (exposure managing board) that is determined to be exceeded is present (ST33).

That is, in board B that is already loaded on electronic component mounting line 1*a* and on which the production work continues, even if the production work is continued, information on board B whose exposure time limit Tx is exceeded before reaching management release process Q is displayed on display unit 34. Thereby, even in board B during production work, the operator is able to be aware at an early stage of presence of another board B that exceeds exposure time limit Tx and is able to easily be aware of the location. Note that, when the exceeded determination of board B that is managed by location management unit 31*e* is performed, required time calculator 31*b* respectively calculates expected duration Tp from the electronic component mounting device in which each board B is present before reaching management release process Q.

In addition, in the warning process, in place of notifying notification units L1 to L4 of the electronic component mounting device on which board B is present or simultaneously, exposure time management unit 31*a* may display information which includes a location of board B in which there is an exceeded determination in display unit 34 of management computer 3, or the display unit (illustration omitted) which each electronic component mounting device is provided with. That is, in a case where there is an exceeded determination (Yes in ST31), exposure time management unit 31*a* displays information which includes the location of board B (exposure managing board) that is determined to be exceeded on display unit 34.

As described above, in a first applied example of the electronic component mounting method of the embodiment, package code Cp (identification information) is read by package ID reader Rp (recognition unit) while package bag P is open, and the time at which package code Cp is read is stored as open time T0. Then, board code Cb (board ID) is applied to board B (exposure managing board) by board ID printing apparatus 4 (board ID application unit), and board code Cb that is applied to board B which is loaded on electronic component mounting line 1*a* is read by board ID reader Rb (line side reading unit).

Then, the time from open time T0 until a time at which board code Cb is read by board ID reader Rb is stored as elapsed time Tt from board B being exposed in the atmosphere, and expected duration Tp which is necessary from board B being loaded on component mounting line 1*a* until reaching management release process Q. Then, it is determined whether or not exposure time limit Tx is exceeded before board B on which board code Cb is read reaches management release process Q based on calculated expected duration Tp and elapsed time Tt.

Thereby, it is possible to manage mounting quality such as quality of solder bonding on the mounting board in the production process of the mounting board which mounts electronic component D on board B on which management of exposure time Te of exposure in the atmosphere is necessary by opening package bag P which is managed with respect to moisture absorption, that is, protected from the atmosphere.

Figure 9:
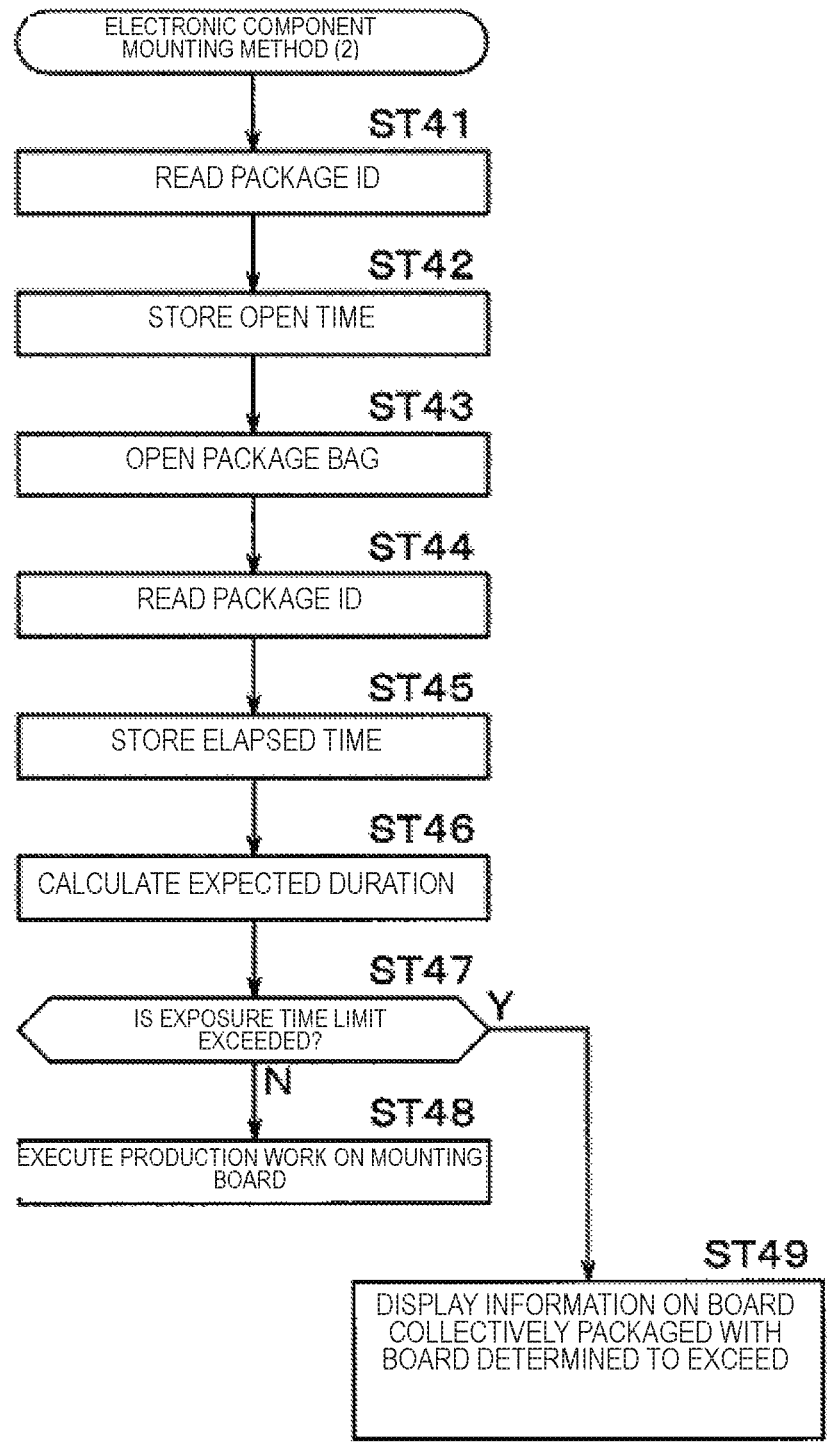
FIG. 9 is a flow diagram of the electronic component mounting method of a second applied example of an embodiment of the disclosure.
Figure 10:
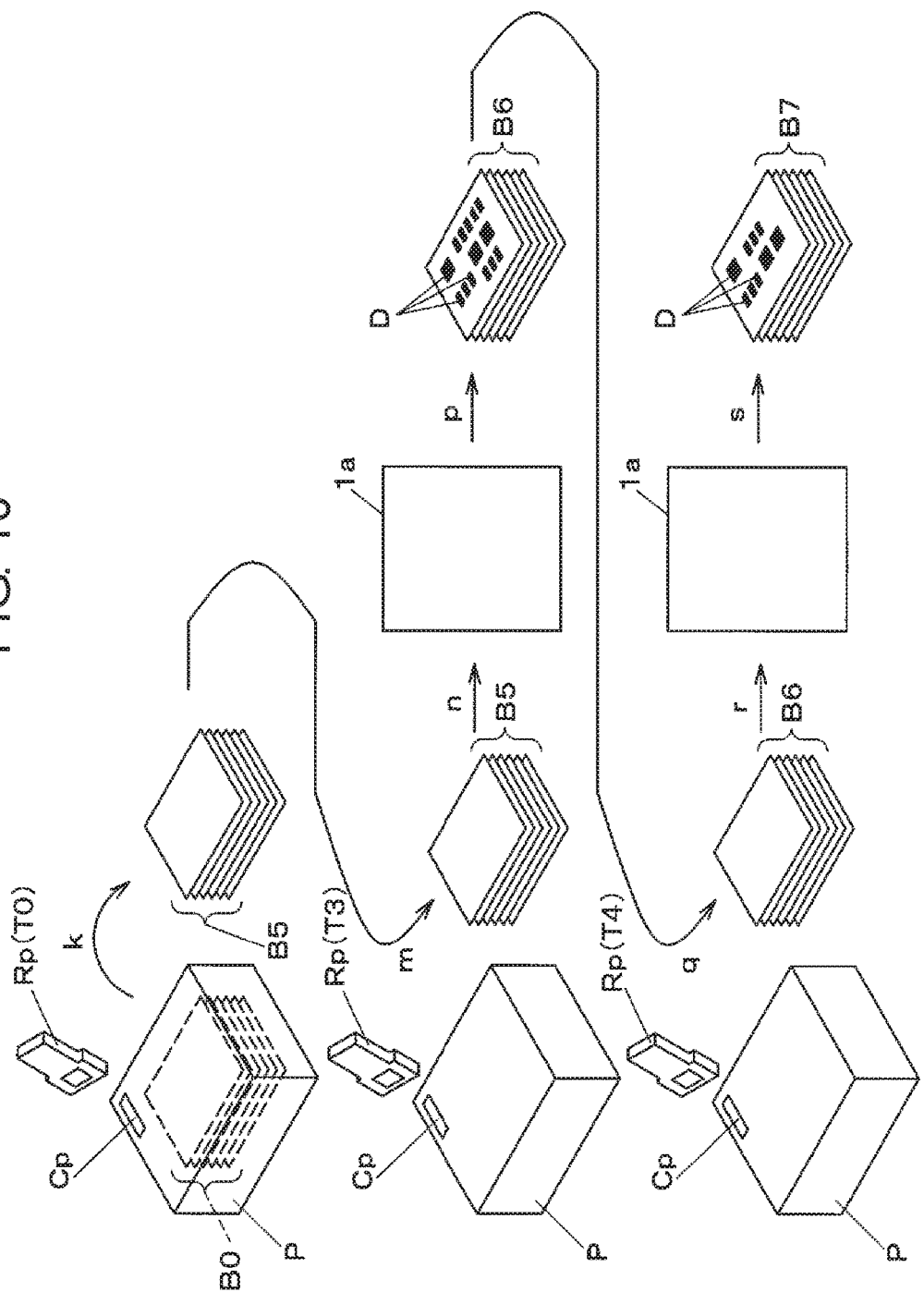
FIG. 10 is an explanatory diagram of the electronic component mounting method of a second applied example of an embodiment of the disclosure.

Next, a second applied example of an electronic component mounting method which produces the mounting board by mounting electronic component D on board B (exposure managing board) in which management is necessary of exposure time Te which is exposed in the atmosphere by opening package bag P that is protected from the atmosphere will be described while referencing FIGS. 10 and 11 in line with the flow in FIG. 9. When board B is loaded on electronic component mounting line 1*a*, in the second applied example, reading of package code Cp that is applied to package bag P is different with respect to reading of board code Cb that is applied to board B in the first applied example. In addition, in the second applied example, plurality of boards B (hereinafter, referred to as "same package board B") which are collectively packaged in package bag P are collectively transported, and production work is carried out in electronic component mounting line 1*a*.

First, package code Cp that is applied to package bag P is read by package ID reader Rp and is stored as read package ID data 32*d* (ST41), and the read time is stored as open time T0 (ST42). Next, package bag P is opened by the operator (ST43), and the same package board B5 is picked up (arrow k in FIG. 10). ST41 to 43 are the same as ST1 to 3 of the first applied example.

Next, picked up same package board B5 is transported up to the electronic component mounting line 1*a* (arrow m), and the package code Cp (identification information) that is applied to package bag P is read by package ID reader Rp (line side reading unit) (ST44: identification information reading process). Next, elapsed time calculator 31*c* stores a time from open time T0 until a time at which package code Cp (identification information) is read by package ID reader Rp (line side reading unit) (hereinafter, referred to as "rear surface loading time T3") as elapsed time Tt3 after the same board B5 (exposure managing board) is exposed in the atmosphere in management storage unit 32 (storage unit) (ST45: second elapsed time storage process).

Next, required time calculator 31*b* calculates expected duration Tp3 which is necessary from rear surface loading time T3 (predetermined point of time) before reaching management release process Q, and stores as expected duration data 32*b* (ST46: second required time calculation process). Next, determination unit 31*d* determines whether or not exposure time limit Tx is exceeded before the same board B5 (exposure managing board) that is transported on electronic component mounting line 1*a* reaches management release process Q based on calculated expected duration Tp3 and elapsed time Tt3 (ST47: second determination process).

Next, in the second determination process, in a case where there is no exceeded determination (No in ST47), the same board B5 is loaded on electronic component mounting line 1*a* (arrow n), production work of the mounting board is executed in electronic component mounting line 1*a* (arrow p), and electronic component D is placed on the rear surface of the same board B6 (ST48). In the example of FIG. 11, since the sum of elapsed time Tt3 and expected duration Tp3 does not exceed exposure time limit Tx, No is determined in the second determination process (ST47).

When electronic component D is placed on the rear surface of the same board B6, the same board B6 is transported to electronic component mounting line 1*a* on which electronic component D is placed on the front surface (arrow q). Next, in the same manner as when electronic component D is placed on the rear surface, the identification information reading process (ST44), the second elapsed time storage process (ST45), the second required time calculation process (ST46), and the second determination process (ST47) are performed. That is, elapsed time Tt4 is calculated from the time at which package code Cp of package bag P is read (hereinafter, referred to as "front surface loading time T4"), it is determined whether or not exposure time limit Tx is exceeded from calculated expected duration Tp4 before the same board B6 reaches management release process Q.

Figure 11:
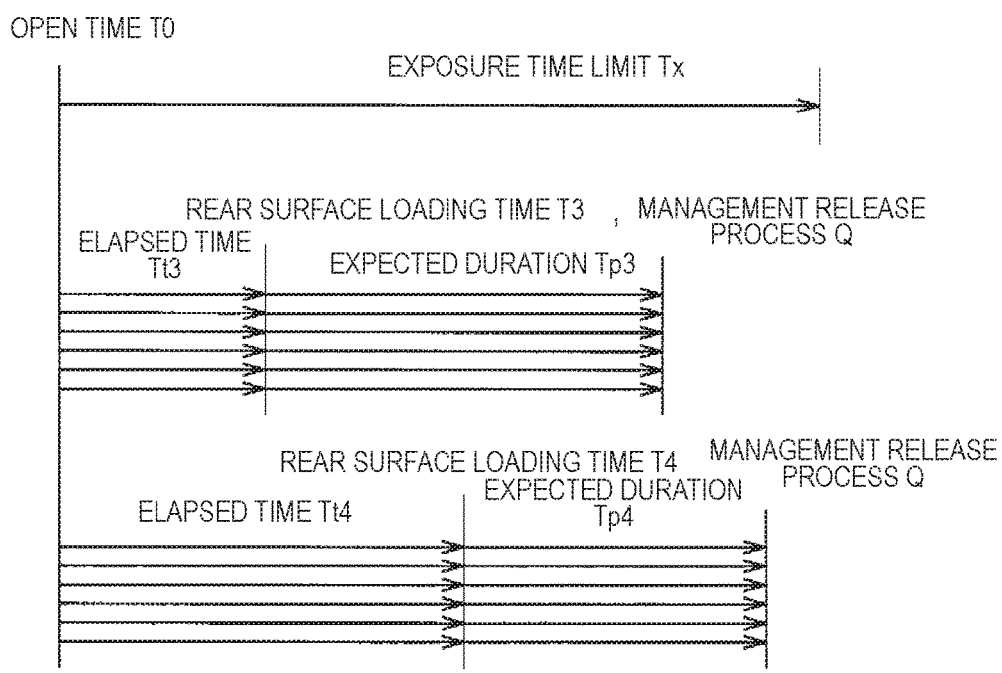
FIG. 11 is an explanatory diagram of an exposure time limit and an expected duration in the electronic component mounting method of a second applied example of an embodiment of the disclosure.

In the example of FIG. 11, since the sum of elapsed time Tt4 and expected duration Tp4 does not exceed exposure time limit Tx, No is determined in the second determination process (ST47). Next, the same board B6 is loaded on electronic component mounting line 1a (arrow r), production work of the mounting board is executed in electronic component mounting line 1a (arrow s), and electronic component D is placed on the rear surface of the same board B7.

In a case where there is an exceeded determination for the same board B5 (B6) (Yes) in the second determination process (ST47), exposure time management unit 31a displays information on the same board B5 (B6) (exposure managing board) that is collectively packaged is displayed on display unit 34 (ST49). Thereby, the operator is able to be easily aware of information on the same board B5 (B6) that exceeds exposure time limit Tx without printing board code Cb on each board B.

As described above, in a second applied example of the electronic component mounting method of the embodiment, package code Cp (identification information) is read by package ID reader Rp (recognition unit) while package bag P is open, and the time at which package code Cp is read is stored as open time T0. Then, package ID reader Rp (line side reading unit) reads package code Cp that is applied to package bag P in which board B that is loaded on electronic component mounting line 1a is packaged.

Then, the time from open time T0 until a time at which package code Cp is read by package ID reader Rp is stored as elapsed time Tt from board B being exposed in the atmosphere, and expected duration Tp which is necessary from board B being loaded on component mounting line 1a before reaching management release process Q. Then, it is determined whether or not exposure time limit Tx is exceeded before board B that is loaded on electronic component mounting line 1a reaches management release process Q based on calculated expected duration Tp and elapsed time Tt.

Thereby, it is possible to manage mounting quality such as quality of solder bonding on the mounting board without applying board code Cb (board ID) to board B in the production process of the mounting component which mounts electronic component D on board B on which management of exposure time Te of exposure within the atmosphere is necessary by opening package bag P which is managed with respect to moisture absorption, that is, protected from the atmosphere.

Next, a third applied example of an electronic component mounting method which produces the mounting board by mounting electronic component D on board B (exposure managing board) in which management is necessary of exposure time Te which is exposed in the atmosphere by opening package bag P that is protected from the atmosphere will be described. In the third applied example, it is determined whether or not board B has an exceeded determination based on production plan S which includes the production number and a production period of the mounting board on which board B (exposure managing board) is used.

First, required time calculator 31b calculates expected duration Tp which is necessary from the predetermined point of time until reaching management release process Q, based on stored production plan data 32g (third required time calculation process). Expected duration Tp in the third required time calculation process is calculated from a time which is necessary in transport of board B between each device, printing time of solder printing apparatus M1 based on the size, printing speed, and the like of board B, mounting time of each electronic component D which is mounted on the board, and the like.

In addition, expected duration Tp may be calculated by simulation based on production plan data 32g, and may be calculated from actual results of the production time of the mounting board that is produced in the past. A point in time at which, for example, board B is exposed in the atmosphere (open time T0) is used as a predetermined point of time.

Next, production plan determination unit 31f determines whether or not production of the mounting board of a planned number is possible without board B (exposure managing board) exceeding exposure time limit Tx based on production plan S and calculated expected duration Tp (production plan determination process). That is, the number of boards B whose exposure time limit Tx is exceeded are calculated based on the number of planned boards B in production plan S and expected duration Tp, and it is determined that production of the mounting board is possible in a case where the number of boards B whose exposure time limit Tx is exceeded is zero.

Thereby, in a case where the mounting board is produced in accordance with production plan S, it is possible to be aware of validity of the production plan of whether or not production of the mounting board is possible without exceeding exposure time limit Tx at an early stage prior to the start of production of the mounting board. Note that, the production plan determination process may be carried out prior to production of the mounting board starting in the first applied example and the second applied example of the electronic component mounting method described above. Thereby, it is possible to manage quality of the mounting board in the production process of the mounting board which mounts electronic component D on the exposure managing board.

Note that, in the production plan determination process, in a case where it is determined that production of the mounting board of the planned number without exceeding exposure time limit Tx is not possible, that is, in a case where the number of boards B which exceed exposure time limit Tx is not zero, the worker may be notified of modification of production plan S such that the number of the mounting boards which exceed exposure time limit Tx is produced using another electronic component mounting line 1a.

INDUSTRIAL APPLICABILITY

The electronic component mounting system and the electronic component mounting method of the disclosure has an effect such that it is possible to manage quality of the mounting board in a production process of the mounting board which mounts the electronic component on the board on which management is necessary with respect to moisture absorption and oxidization, and is useful in a component mounting field which mounts the component on the board.

What is claimed is:

1. An electronic component mounting system, which produces a mounting board, comprising:
    an electronic component mounting line which produces the mounting board by mounting an electronic component on an exposure managing board in which management is necessary of an exposure time of exposure in the atmosphere by opening a package bag that is protected from the atmosphere;
    a recognition unit which recognizes identification information that is applied to the package bag;

a storage unit which stores an exposure time limit which is permissible from the exposure managing board being exposed in the atmosphere before reaching a management release in which management of the exposure time is unnecessary;

a required time calculator which calculates an expected duration which is necessary from a predetermined point of time before reaching the management release; and a determination unit which determines whether or not the exposure time limit is exceeded before the exposure managing board that is exposed in the atmosphere reaches the management release, wherein the recognition unit reads the identification information during opening of the package bag, wherein the storage unit stores a time at which the identification information is read by the recognition unit as an open time, and wherein the determination unit determines whether or not the exposure time limit is exceeded before the exposure managing board that is exposed in the atmosphere reaches the management release based on the calculated expected duration and the open time.

2. The electronic component mounting system of claim 1, further comprising:

a board ID application unit which applies a board ID to the exposure managing board that is exposed in the atmosphere by opening the package bag; and a line side reading unit which reads the board ID which is applied to the exposure managing board which is loaded on the electronic component mounting line, wherein the storage unit stores a time from the open time until a time at which the board ID is read by the line side reading unit as an elapsed time from exposure of the exposure managing board in the atmosphere, and wherein the determination unit determines whether or not the exposure time limit is exceeded before the exposure managing board of which the board ID is read reaches the management release based on an expected duration which is necessary from loading of the exposure managing board on the electronic component mounting line calculator before reaching the management release and is calculated by the required time calculator, and the elapsed time.

3. The electronic component mounting system of claim 2, further comprising:

a display unit which displays information on the exposure managing board which exceeds the exposure time limit, wherein a plurality of the exposure managing boards are collectively packaged in one package bag, and wherein when the exposure managing board is determined to exceed the exposure time limit by the determination unit, information on the exposure managing board for which the board ID is not read out of the exposure managing board that is collectively packaged with the exposure managing board is displayed on the display unit.

4. The electronic component mounting system of claim 2, further comprising:

a display unit which displays information on the exposure managing board which exceeds the exposure time limit, when the exposure managing board is determined to exceed the exposure time limit by the determination unit, the determination unit further determines whether or not the exposure managing board for which the board ID is not read exceeds the exposure time limit, and information on the exposure managing board which is determined to exceed is displayed on the display unit.

5. The electronic component mounting system of claim 2, wherein the electronic component mounting line has a plurality of electronic component mounting devices which execute work for producing the mounting board, wherein the electronic component mounting system further comprises:

a display unit which displays information on the exposure managing board which exceeds the exposure time limit; and a location management unit which manages respective locations of the exposure managing board based on information on production of the mounting board by the electronic component mounting line, and wherein when the exposure managing board is determined to exceed the exposure time limit by the determination unit, the determination unit further determines whether or not the exposure managing board which is managed by the location management unit exceeds the exposure time limit, and information on the exposure managing board which is determined to exceed is displayed on the display unit.

6. The electronic component mounting system of claim 2, wherein the electronic component mounting line has a plurality of electronic component mounting devices which execute work for producing the mounting board, wherein the electronic component mounting device has a notification unit which notifies a location of the exposure managing board, wherein the electronic component mounting system further comprises a location management unit which manages respective locations of the exposure managing board based on information on production of the mounting board by the electronic component mounting line, and wherein when the exposure managing board is determined to exceed the exposure time limit by the determination unit, the determination unit further determines whether or not the exposure managing board which is managed by the location management unit exceeds the exposure time limit, and notifies that there is an exposure managing board which exceeds the exposure time limit to the notification unit of the electronic component mounting device on which the exposure managing board is present that is determined to exceed.

7. The electronic component mounting system of claim 1, further comprising:

a line side reading unit which reads the identification information which is applied to the package bag in which the exposure managing board which is loaded on the electronic component mounting line is packaged, wherein the storage unit stores a time from the open time until a time at which the identification information is read by the line side reading unit as an elapsed time from exposure of the exposure managing board in the atmosphere, and wherein the determination unit determines whether or not the exposure time limit is exceeded before the exposure managing board which is loaded on the electronic component mounting line reaches the management release based on an expected duration which is necessary from loading of the exposure managing board on the electronic component mounting line calculator before reaching the management release and is calculated by the required time calculator, and the elapsed time.

8. The electronic component mounting system of claim 7, further comprising:
a display unit which displays information on the exposure managing board which exceeds the exposure time limit,
wherein a plurality of the exposure managing boards are collectively packaged in one package bag, and
wherein when the exposure managing board is determined to exceed the exposure time limit by the determination unit, information on the exposure managing board that is collectively packaged with the exposure managing board is displayed on the display unit.

9. An electronic component mounting method, which produces a mounting board, in an electronic component mounting system including an electronic component mounting line which produces the mounting board by mounting the electronic component on an exposure managing board for which management is necessary of an exposure time of exposure in the atmosphere by opening a package bag that is protected from the atmosphere, a recognition unit which recognizes identification information that is applied to the package bag, and a storage unit which stores an exposure time limit which is permissible from the exposure managing board being exposed in the atmosphere before reaching a management release in which management of the exposure time is unnecessary, the method comprising:
reading identification information during opening of the package bag using the recognition unit;
storing a time at which the identification information is read in the storage unit as an open time;
calculating an expected duration which is necessary from a predetermined point of time before reaching the management release, and
determining whether or not the exposure time limit is exceeded before the exposure managing board that is exposed in the atmosphere reaches the management release based on the calculated expected duration and the open time.

10. The electronic component mounting method of claim 9,
wherein the electronic component mounting system further includes a board ID application unit which applies a board ID to the exposure managing board that is exposed in the atmosphere by opening the package bag, and a line side reading unit which reads the board ID which is applied to the exposure managing board which is loaded on the electronic component mounting line,
wherein the method further comprises:
applying the board ID to the exposure managing board using the board ID application unit;
reading the board ID which is applied to the exposure managing board using the line side reading unit; and
storing in the storage unit a time from the open time until a time at which the board ID is read by the line side reading unit as an elapsed time from exposure of the exposure managing board in the atmosphere, and
wherein in the determination, it is determined whether or not the exposure time limit is exceeded before the exposure managing board of which the board ID is read reaches the management release based on an expected duration which is necessary from loading of the exposure managing board on the electronic component mounting line before reaching the management release and is calculated in the required time calculation, and the elapsed time.

11. The electronic component mounting method of claim 10,
wherein the electronic component mounting system further includes a display unit which displays information on the exposure managing board which exceeds the exposure time limit,
wherein a plurality of the exposure managing boards are collectively packaged in one package bag, and
wherein in a case where the exposure managing board is determined to exceed the exposure time limit in the determination, displaying on the display unit information on the exposure managing board for which the board ID is not read out of the exposure managing board that is collectively packaged with the exposure managing board.

12. The electronic component mounting method of claim 10,
wherein the electronic component mounting system further includes a display unit which displays information on the exposure managing board which exceeds the exposure time limit, and
wherein in a case where the exposure managing board is determined to exceed the exposure time limit in the determination, it is further determined whether or not the exposure managing board for which the board ID is not read exceeds the exposure time limit before reaching the management release, and displays on the display unit information on the exposure managing board which is determined to exceed.

13. The electronic component mounting method of claim 10,
wherein the electronic component mounting line has a plurality of electronic component mounting devices which execute work for producing the mounting board,
wherein the electronic component mounting system further includes a display unit which displays information on the exposure managing board which exceeds the exposure time limit, and a location management unit which manages respective locations of the exposure managing board based on information on production of the mounting board by the electronic component mounting line, and
wherein in a case where the exposure managing board is determined to exceed the exposure time limit in the determination, it is further determined whether or not the exposure managing board which is managed by the location management unit exceeds the exposure time limit before reaching the management release, and information on the exposure managing board which is determined to exceed is displayed on the display unit.

14. The electronic component mounting method of claim 10,
wherein the electronic component mounting line has a plurality of electronic component mounting devices which execute work for producing the mounting board,
wherein the electronic component mounting device has a notification unit which notifies a presence of the exposure managing board,
wherein the electronic component mounting system further includes a location management unit which manages respective locations of the exposure managing board based on information on production of the mounting board by the electronic component mounting line, and
wherein in a case where the exposure managing board is determined to exceed the exposure time limit in the determination, it is further determined whether or not the exposure managing board which is managed by the location management unit exceeds the exposure time limit before reaching the management release, and notifies that there is an exposure managing board which exceeds the exposure time limit to the notification unit of the electronic component mounting device on which the exposure managing board is present that is determined to exceed.

15. The electronic component mounting method of claim 9,
wherein the electronic component mounting system further includes a line side reading unit which reads the identification information which is applied to the package bag in which the exposure managing board which is loaded on the electronic component mounting line is packaged,
wherein the electronic component mounting method further comprises:
reading the identification information using the line side reading unit; and
storing in the storage unit a time from the open time until a time at which the identification information is read by the line side reading unit as an elapsed time from exposure of the exposure managing board in the atmosphere, and
wherein in determination, it is determined whether or not the exposure time limit is exceeded before the exposure managing board which is loaded on the electronic component mounting line reaches the management release based on an expected duration which is necessary from loading of the exposure managing board on the electronic component mounting line before reaching the management release and is calculated in the required time calculation, and the elapsed time.

16. The electronic component mounting method of claim 15,
wherein the electronic component mounting system further includes a display unit which displays information on the exposure managing board which exceeds the exposure time limit,
wherein a plurality of the exposure managing boards are collectively packaged in one package bag, and
wherein in a case where the exposure managing board is determined to exceed the exposure time limit in the determination, information on the exposure managing board that is collectively packaged is displayed on the display unit.

* * * * *